United States Patent [19]

McGeoch et al.

[11] Patent Number: 5,199,033
[45] Date of Patent: Mar. 30, 1993

[54] SOLID STATE MEMORY ARRAY USING ADDRESS BLOCK BIT SUBSTITUTION TO COMPENSATE FOR NON-FUNCTIONAL STORAGE CELLS

[75] Inventors: Bruce M. McGeoch, Cupertino; Scott E. Richmond, San Jose, both of Calif.

[73] Assignee: Quantum Corporation, Milpitas, Calif.

[21] Appl. No.: 521,575

[22] Filed: May 10, 1990

[51] Int. Cl.$^5$ ............................................. G06F 11/00
[52] U.S. Cl. ................................. 371/10.1; 371/10.2; 365/200
[58] Field of Search ..................... 371/10.1, 10.2, 21.6, 371/10.3, 13, 15.1, 20.3; 365/200; 381/44

[56] References Cited

U.S. PATENT DOCUMENTS

| | | | |
|---|---|---|---|
| 3,644,902 | 2/1972 | Beausoleil | 340/146 |
| 4,310,901 | 1/1982 | Harding et al. | 371/10.2 |
| 4,376,300 | 3/1983 | Tsang | 371/10.1 |
| 4,394,763 | 7/1983 | Nagano et al. | 371/38 |
| 4,422,161 | 12/1983 | Kressel et al. | 371/10.3 |
| 4,506,362 | 3/1985 | Morley | 371/13 |
| 4,648,075 | 3/1987 | Segawa et al. | 371/10.1 |
| 4,694,454 | 9/1987 | Matsuura | 371/13 |
| 4,807,274 | 2/1989 | Kousa | 371/20.3 |
| 4,942,556 | 7/1990 | Sasaki et al. | 371/10.1 |
| 4,942,575 | 7/1990 | Earnshaw et al. | 371/10.1 |

OTHER PUBLICATIONS

"Voice Entry: Terminals You Can Talk To" by Edward F. O'Neil, 1985, pp. 303-307.
"Digital Integrated Circuits" by Arthur H. Seidman, pp. 178-181, 1983.
Data Sheet, "1 Mega Audio Dram", Micron Technology, Inc.

Primary Examiner—Robert W. Beausoliel
Assistant Examiner—Phung My Chung
Attorney, Agent, or Firm—David B. Harrison

[57] ABSTRACT

A solid state memory array includes an address bus and a bidirectional data bus and a plurality of partly defective VLSI memory array chips each containing at least one megabit of data storage capacity, having defective memory cell locations, being connected to the address bus, and providing plural data storage bit positions. Each memory array chip has a bidirectional tri-state driver connected between the bit lines thereof and corresponding ones of the data bus. At least one VLSI substitution memory chip contains at least one megabyte of data storage capacity, is connected to the address bus and provides plural data storage bit positions. A substitution chip tri-state driver is connected between the bit lines of the substitution memory chip and all of the parallel data bit lines of the data bus. A programmable read only memory is connected to be addressed by the address bus and is programmed for putting out a binary coded value which has been coded to identify each said defective memory cell location of each one of the memory array chips. A decoder is connected to receive and decode the binary coded value into tri-state driver control values and applies the values to the substitution chip tri-state driver and to one of the memory array chip bidirectional tri-state drivers so as to disable the memory array chip associated with the particular chip driver when a defective memory cell location thereof is addressed, and to enable the substitution memory chip at the particular location and connect it to the data bus in place of the associated memory array chip.

11 Claims, 3 Drawing Sheets

SOLID STATE MEMORY ARRAY USING ADDRESS BLOCK BIT SUBSTITUTION TO COMPENSATE FOR NON-FUNCTIONAL STORAGE CELLS

FIELD OF THE INVENTION

The present invention relates to computer memory arrays. More particularly, the present invention relates to a method and apparatus for mapping non-functional locations of random access memory array chips, such as Audio DRAM chips, on an address block bit substitution basis so that the chips may thereafter be used within a computer memory storage subsystem.

BACKGROUND OF THE INVENTION

Computer systems following conventional architectures include a central processing unit (CPU) and a main memory array which is used to store the applications and operating systems control programs which are executed by the CPU. A bus structure enables the CPU and main memory array to receive and send data to peripheral equipment such as input/output devices and auxiliary data storage and retrieval devices such as disk drives.

In one early era in the development of digital computers, main memory was comprised of an array of memory cores which were small electromagnetic toroidal cores manifesting hysteresis, i.e. a magnetic on-state and a magnetic off-state. The hand-wired core arrays were subsequently replaced by solid state semiconductor memory arrays. One type of array was known as static random access memory or SRAM, while another type of array was known as dynamic random access memory or DRAM. DRAMs typically required less power and provided superior data store and retrieval characteristics than were achieved with SRAMS. However, DRAMs, being dynamic in nature, required periodic refreshing operations to maintain the data.

DRAM technology has progressed to the point where single DRAM chips may provide as much as a megabit or four megabits, or more, of storage. For example, an array of eight one megabit chips provides a megabyte of data storage capacity while an array of 16 one megabit chips provides a megaword of data storage capacity. Larger capacity chips provide even greater storage capacities. In order to assure integrity of each bit position within a particular address location, several approaches have been followed. The simplest approach is a single additional parity bit position which checks the parity (odd or even) of the particular byte or word to be stored at the address and indicates an error if, as actually stored, the parity is different than anticipated.

Another approach is to provide an error correction scheme which requires as many as six extra bit positions for a 16 bit word. One example of such approach is provided by the Nagano et al. U.S. Pat. No. 4,394,763. This patent describes a method for detecting two-bit errors with an error correction code (ECC) scheme and then swapping a spare bit storage cell in place of a suspected defective cell and rerunning the bus memory transfer cycle. If only a single error remains, the ECC corrects this error and the process continues. In other words, the Nagano et al. approach was to provide dynamic bit swapping within an ECC scheme in order to replace bad bit cells with substitute good bit cells during operation of the memory array. The evident drawback of the Nagano et al. approach is that the ECC scheme requires considerable overhead in order to provide a six bit error correction code value for each sixteen bit word.

Another technique suggested by the prior art in Beausoleil U.S. Pat. No. 3,644,902 is to provide a mechanism for physically reconfiguring the boards comprising a memory array, so that an arrangement of boards in which a data word has a two bit error is changed to a new arrangement wherein a single bit error remains. Then, conventional ECC techniques may be used to correct for the single bit error.

DRAM chips are typically specified as having certain electrical characteristics. For computer service, characteristics such as power consumption, access times (speed), refresh rate, and freedom from nonfunctional storage locations are considered to be critical. Unfortunately, the manufacturing process is not yet sufficiently reliable in the megabit capacity ranges to provide full yields of chips that meet or exceed specifications relating to these four characteristics. However, a significant number of chips are produced which meet a slightly relaxed or less stringent set of specifications.

Since these chips cannot be reliably used within computer main memory, they are available at significantly lower cost than chips which meet the more stringent specifications for use within main memory of a digital computer. Other applications having relaxed specifications have been proposed and found for these chips, mostly within digital audio voice recording systems wherein single bit or several bit non-functionality will not perceptibly degrade reconstituted audio information. One application is for storing digital messages within telephone answering machines. Thus, these chips have come to be known within the semiconductor industry as "AUDIO DRAM".

The problem of storage media defects has been encountered and solved within disk drives. Disk drives store data in concentric data tracks formed at the surface of one or more rotating disks carrying a magnetic coating. Each concentric data track or cylinder location of a fixed disk drive is typically formatted into a number of data sectors. Each sector typically includes a sector header and storage space to store a 512 byte block of data, followed by an error correction code space for ECC data. While many conventional ECC techniques used in disk drives can detect two hard (i.e., repeating) bit errors, and correct one or two bit errors within a predetermined bit span, ECC techniques break down when more errors are present within the span.

In order to compensate for multiple data bit defects within a sector or block, the data track or cylinder location may be provided with a spare sector, so that during a data format operation, the spare sector may be pressed into service to provide storage for a sector determined to have a media defect. In one known approach, the defective sector is skipped over during the format operation and its storage capacity made up by pressing the spare sector into service. In another approach, a seek or head select is made to the spare sector in lieu of the defective sector in accordance with a defect map to which the disk drive controller has direct access. These techniques are collectively referred to in the disk drive art as "sector sparing".

A hitherto unsolved need has arisen for the practical utilization of Audio DRAM within computing systems in order to realize a low cost, high storage capacity solid state memory array.

SUMMARY OF THE INVENTION WITH OBJECTS

A general object of the present invention is to provide a method and apparatus for mapping non-functional storage locations of random access memory semiconductor arrays so that the arrays may thereafter be used as computer grade memory.

A more specific object of the present invention is to establish a defect map within a programmable read only memory (PROM) during fabrication of a computer memory array comprised of semiconductor memory chips in which predetermined good substitution blocks of one or more spare data bit positions are mapped by the PROM to replace blocks of bits at one or more data bit positions of the array containing one or more bit errors.

Yet another specific object of the present invention is to configure a memory array for a computing system from semiconductor memory chips containing a plurality of non-functional storage locations in a manner which maps around any defective storage locations of the chips on a bit position, address block substitution basis.

A memory array in accordance with the principles of the present invention comprises a main array of large scale integrated circuit semiconductor memory chips of predetermined data storage size which are addressed in parallel by lines of an address bus and wherein each chip stores at least one, and as many as four or more, bit positions of an n-bit data word. The chips of the main array are characterized by possibly having one or more non-functional bit storage locations at one or more predetermined address locations as designated by logical signals on the lines of the address bus. The memory array further comprises one or more spare memory data bits having a predetermined data storage block size, a read only memory connected to predetermined bit lines of the address bus and containing a block substitution map correlated to the locations of the said one or more nonfunctional data bit data bit storage locations of the main array for generating substitution signals from address locations and from the substitution map, and a substitution circuit connected to the main array and to the spare memory data bits and responsive to the substitution signals generated by the read only memory for swapping a block of contiguous address locations of one of the spare memory data bits for a block of the main array containing the said nonfunctional data bit location when an address location designated by the logical signals on the lines of the address bus identifies the said block.

In one aspect of the present invention the memory chips of the main array comprise DRAM chips, and the memory array further comprises a memory controller connected between the lines of the address bus and the chips of the main array for generating and supplying time multiplexed column address selection information and row address selection information to the main array from logical signals on the lines of the address bus and for generating and supplying recurrent refresh signals to the chips of the main array.

In a further aspect of the present invention, the chips of the main array comprise Audio DRAM.

In one more aspect of the present invention, each Audio DRAM chip of the main array nominally stores in excess of one million bits of data.

In yet another aspect of the present invention the spare memory chip has the same predetermined data storage size as do the chips comprising the main array.

In one more aspect of the present invention the one or more spare memory bits are also comprised of Audio DRAM.

In still one more aspect of the present invention, the size of each address substitution block is, for example, 128 bit storage locations per memory data bit position of the main array and the spare memory data bit position, and address block substitutions are made on e.g., a 128 location basis.

In accordance with the present invention, a method is provided for using relaxed specification semiconductor memory array, such as Audio DRAM, for storing data words of n-bit length within a computing system wherein the semiconductor memory array is characterized by at least one nonfunctional data bit position within a block of address locations, the method comprising the steps of:

providing spare memory means having a predetermined data storage substitution block containing substitution bit locations for substitution in lieu of nonfunctional data bit position within the said block of address locations, mapping the address location of the said block of address locations containing the said at least one nonfunctional data bit position into a substitution map, substituting a bit location of the substitution block for the at least one nonfunctional data bit position of the main array in response to incoming addresses and in response to the substitution map.

These and other objects, advantages, aspects and features of the present invention will be more fully understood and appreciated upon consideration of the following detailed description of a preferred embodiment, presented in conjunction with the accompanying drawing.

BRIEF DESCRIPTION OF THE DRAWINGS

In the Drawings:

FIG. 2a and FIG. 2b together form a more detailed electrical block and schematic diagram of pertinent portions of the computer grade memory array depicted in FIG. 1, wherein FIG. 2a is the left panel and FIG. 2b is the right panel of the diagram.

DETAILED DESCRIPTION OF A PREFERRED EMBODIMENT

Figure 1:
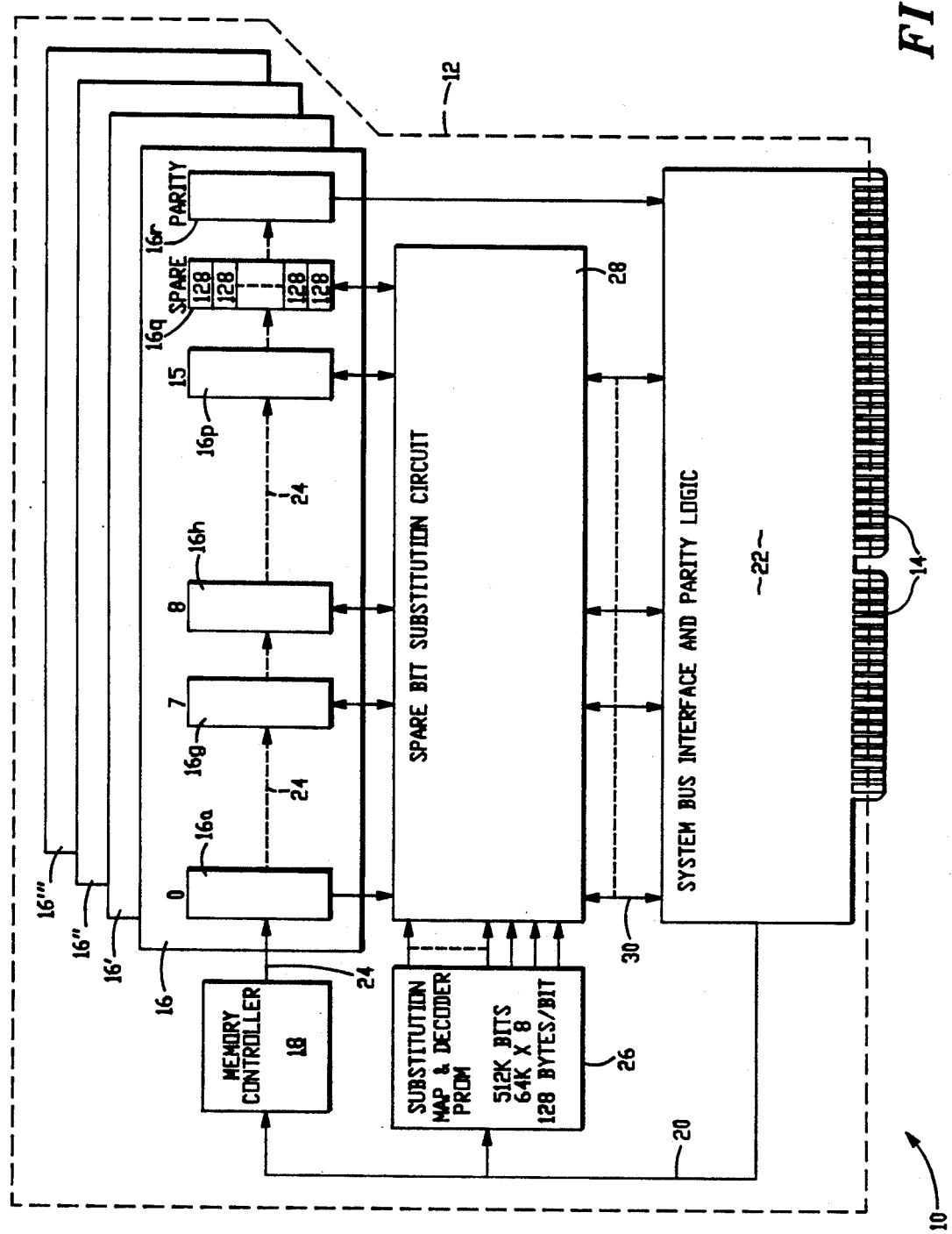
FIG. 1 is a block diagram of a computer grade memory array formed of large scale integrated circuit semiconductor memory chips wherein one or more of the chips may include one or more non-functional locations and further including address block bit substitution for replacing blocks containing the non-functional bit locations with blocks of spare memory bit locations, in accordance with the principles of the present invention.

With reference to FIG. 1, a computer quality memory array 10 is formed on one or more printed circuit substrates 12 which are collectively denoted in FIG. 1 by the dashed line outline surrounding the circuit elements. The substrate 12 includes a conventional edge connector region 14 for connection to address, data and control buses of a host computer system at an expansion slot location thereof, for example. Alternatively, the memory array 10 could be hard-wired into the host computer system.

The memory array 10 includes a plurality of N megabit by one or four bit, very large scale integrated circuit chips 16 which are preferably but not necessarily of Audio DRAM quality, i.e., chips which are characterized by relaxed specifications in comparison to normal computer memory grade DRAM chips, for example.

In the preferred embodiment given in FIG. 1, each chip 16 is one megabit by one VLSI semiconductor array, for example; and, the number N may be 8, 16, 32, etc., which designates the width of the data word to be stored. A sixteen bit data word with single bit position block substitution and parity is contemplated by the array 10 in FIG. 1. The array 10 provides a four megaword storage capacity, Consequently, four banks 16, 16', 16" and 16'" are provided. Each bank includes eighteen Audio DRAM chips, and the first bank 16 is shown in FIG. 1 with chips 16a-r; however, only several representative chips 16a, 16g, 16h, 16p, 16q and 16r are actually denoted by blocks, blocks denoting the chips 16b-f and 16i-16o being omitted to save drawing room. Chip 16q is a spare memory chip, and chip 16r is a parity detection memory chip. While only one spare memory chip 16q is shown in the FIG. 1 memory array 10, it will be evident to those skilled in the art that several spare memory chips may be included, depending upon the storage word bit width and the actual quality of the other chips comprising the overall array 10.

In the preferred embodiment of FIG. 1, all of the Audio DRAM chips 16 are under the direct control of a dynamic memory controller 18. The memory controller 18 connects to an address bus 20 leading to a system interface and parity logic circuit element 22 which in turn provides, a connection via the edge connector 14 to the address central and data buses of the host computer, which may follow the ISA or EISA standard interface specification, for example.

From the addresses present on the address bus 20, the memory controller 18 generates row address selection data (RAS) and column address selection data (CAS) in conventional fashion and supplies these data to all of the Audio DRAM chips 16 via an array address bus 24. RAS and CAS control ports of each chip 16 are also controlled by RAS and CAS signals put out by the memory controller 18.

Since relaxed specification Audio DRAM memory chips are being used, a faster refresh rate may be needed, and if so, the faster refresh rate is generated by the memory controller 18 in order to refresh the storage cells of the chips 16. For example, computer grade dynamic memory chips are typically refreshed at an eight millisecond rate. In the memory 10 using Audio DRAM chips, the refresh rate may be doubled to once every four milliseconds or faster, for example, in order to make up for one of the commonly encountered relaxed specifications of Audio grade DRAM chips. If relaxed specification static random access memory (SRAM) devices are to be used for the memory chips 16, the memory controller would not be required for row and column multiplexing and refresh; and, the address bus 20 could extend directly to the chips 16 through suitable bus drivers.

Another difference in Audio DRAM device specifications is the occasional nonfunctional bit position. Within a particular Audio DRAM, a single bit error may be present, or a physical row or column may not be active, due to a defect in an on-board row or column driver, etc. During the manufacturing process for the array 10, all Audio DRAM storage locations are tested for nonfunctional locations, and a substitution map is generated for the particular nonfunctional locations (if any) in the memory array 10. This information for the chips 16a-16p comprising the active memory array of the system 10 is then used to generate an address block substitution table. Individual semiconductor chips, including the spare chip 16q and the parity chip 16r, may be arranged within the array 10 so that non-functional locations are limited to a single bit position within any block, thereby enabling block substitution by a block of functional storage locations from the single spare chip 16q.

In the presently preferred embodiment, the substitution table is included in a flash-type programmable read only memory array (PROM) 26 arranged as a 64 kilobyte array. The substitution PROM 26 is programmed at the factory in accordance with the defect information for the chips 16a-16p. High order address bit lines of the address bus 20 enter the PROM 26 with 128 storage location blocks of low order addresses being ignored in the presently preferred embodiment.

The PROM 26 generates and puts out a binary mapping value for each 128 storage location block of addresses on the address bus 20. Since the memory array 10 may include one megabit or four megabit, or larger, by one or more bit chips 16, the address bus 20 may present as many as four million distinct addresses, or more, for example. And, these addresses may be for byte (8 bit) locations or word (16, 32 or 64 bit) locations, depending upon the desired configuration.

The binary mapping values put out by the PROM 26 control operation of a spare bit substitution circuit 28. The spare bit substitution circuit 28 functions to substitute e.g., a 128 address block of good memory in the spare chip 16q for a corresponding 128 address block containing one or more nonfunctional bit locations within a data bit position of one of the main memory chips 16a through 16p. While spare bit substitution on a 128 address per block basis is presently preferred, those skilled in the art will appreciate that the sparing block size may be any convenient size, such as 64, 128, 256, etc., dependent in part upon the specifications and characteristics of the particular PROM and DRAM chips being employed. For example, if the DRAM chip includes more than one defective data bit storage locations for each address, the substitution would be carried out for all of the data bit storage locations for the address, on an address block basis.

By way of further example, if the data bit of the chip 16h had one or more nonfunctional storage locations at a hypothetical address FFFF (hex), a block of 128 consecutive addresses including the address FFFF (hex) of the spare data bit of the chip 16q would be mapped by the PROM 26 and switched by the substitution circuit 28 into a corresponding block of 128 addresses of the ninth data bit position otherwise including the nonfunctional data bit location of the chip 16h; and the block of 128 addresses of the data bit of chip 16h containing the nonfunctional location at address FFFF would be mapped out and discarded.

In the preferred embodiment wherein only one spare data bit position is provided, as by the chip 16q, it is to be understood that there can be only one non-functional data bit position within the address block including e.g. the address FFFF of the nonfunctional storage location, since the spare data bit of the chip 16q only provides a single data bit storage position within any single address block.

As already suggested above, if in a particular memory array it is anticipated that there may be plural non-operative data bit positions within a particular address space, the spare memory chip may provide sparing on a byte or word basis, or multiple spare data bits may be provided from a location thereof in order to replace the plural non-operative data bit positions with spare, operative positions from the spare data bits.

If desired, incoming Audio DRAM chips 16 may be screened during the array 10 manufacturing process, and the array 10 assembled by selecting and arranging the Audio DRAM chips such that non-operative single bit locations are corrected by the presently described substitution method and structure employing a single spare data bit position as with a single chip 16q. Alternatively, a plurality of spare data bit positions may be provided within the array 10 and in this situation, no screening of the chips 16 is needed or employed during the manufacturing process other than to locate nonfunctional data bit positions of the array as previously explained.

At another address block containing another hypothetical address FFOO at which the data bit cell of the chip 16h is functional, there would be no need for address block substitution, and so the spare bit substitution circuit is not operated with respect to the data bit of the chip 16h (although it could be substituting a spare data bit for that block address for any one of the other data bit positions 16a-g or 16i-p, as needed).

With the presently described arrangement, the spare bit substitution circuit 28 effectively multiplexes a seventeen data bit memory array into a sixteen bit data bus 30 under the dynamic control of the PROM 26 which responds in real time to operate the switches of the substitution circuit 28 in response to the address value presently appearing on the address bus 20.

As already noted above, FIG. 1 shows that the concepts of the present invention may be extended to plural memory arrays, so that arrays 16, 16', 16" and 16'" may be controlled by a single controller circuit, thereby enabling formation of arrays having very large storage capacity, such as 4 megawords (8 megabytes), or larger, with the relaxed specification, inexpensive chips 16.

Figure 2A:
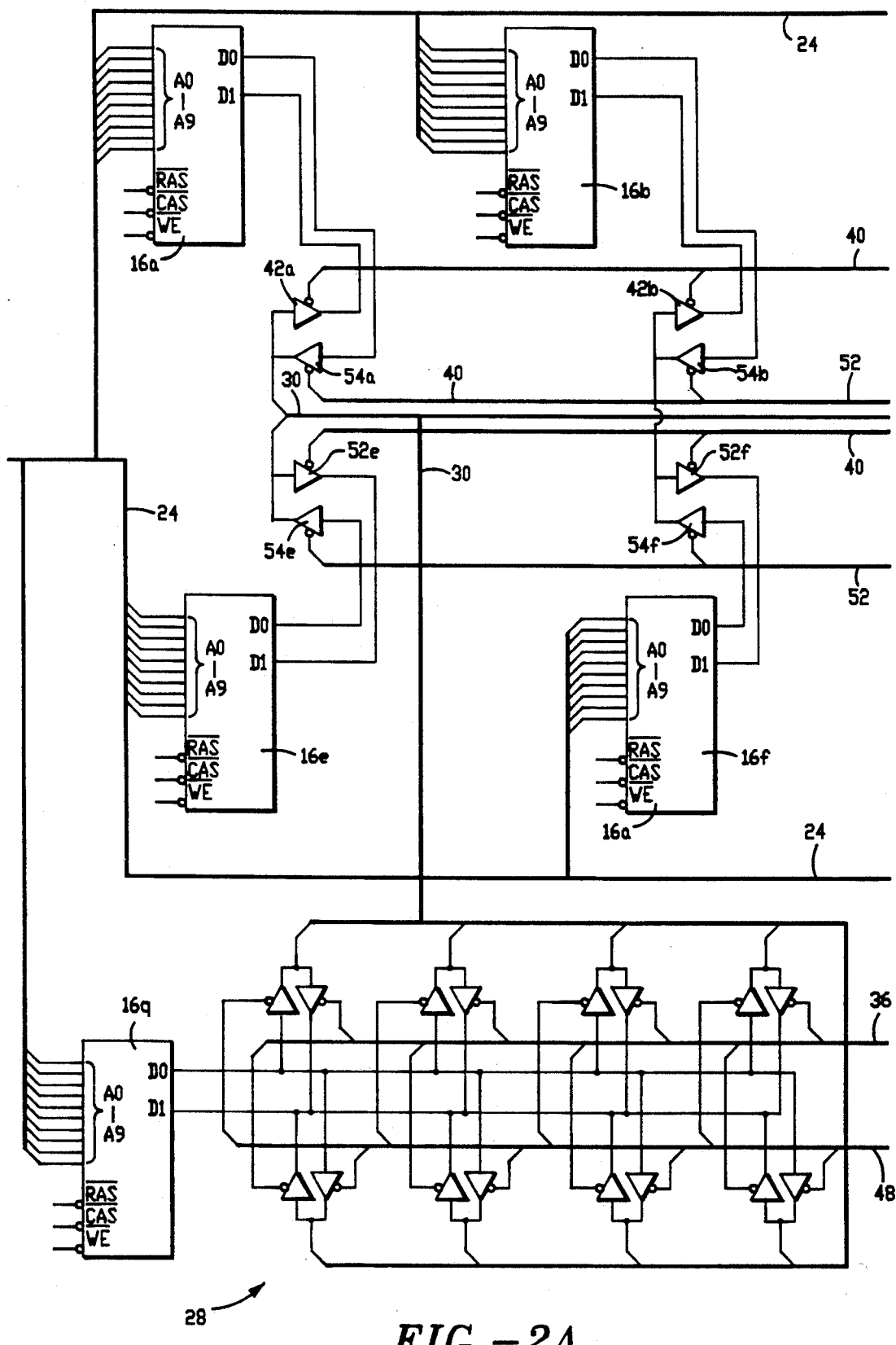
Figure 2B:
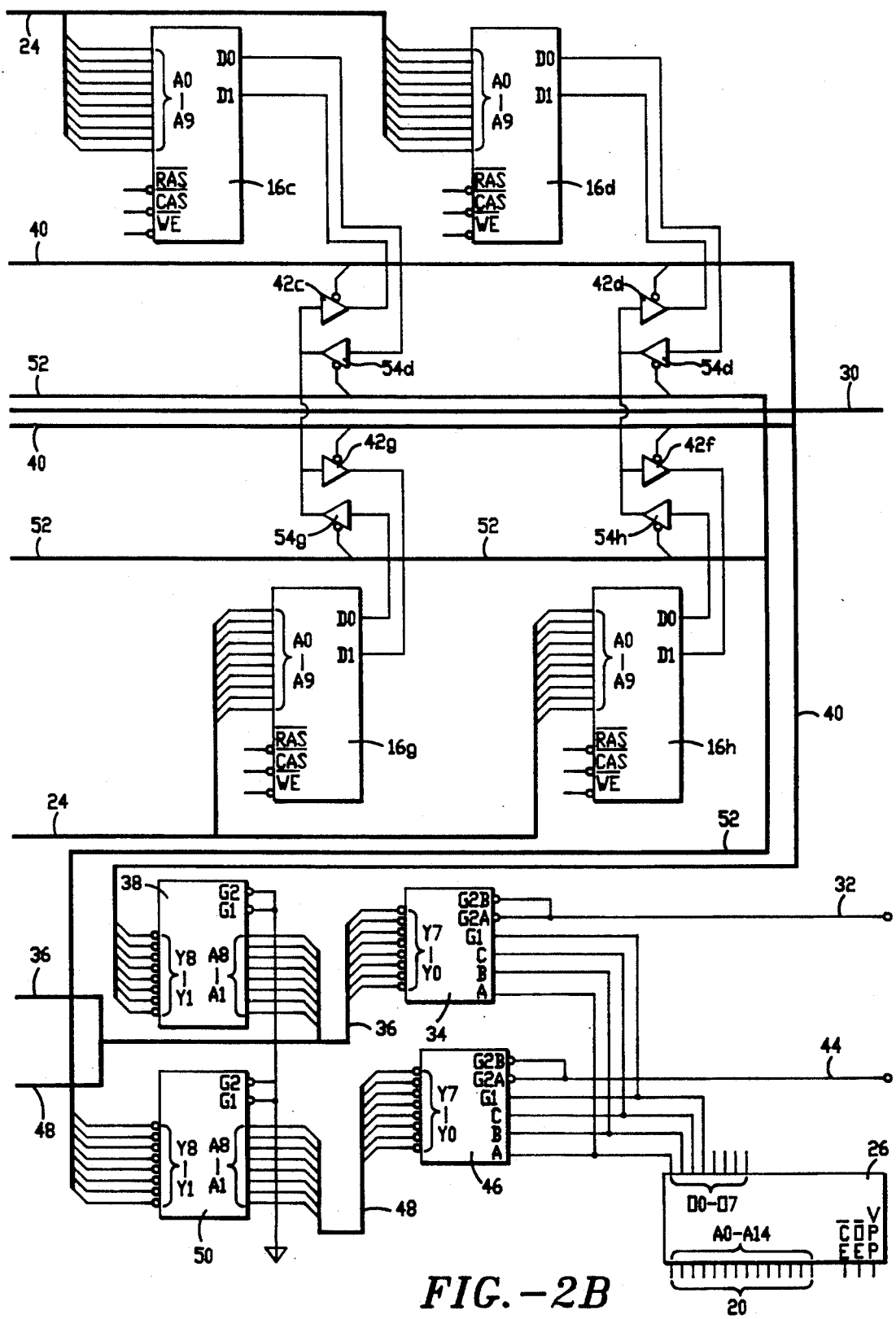

FIGS. 2a and 2b show a practical embodiment of an eight bit (one byte) memory array 10' which is a subset of the array 10 depicted more generally in FIG. 1. Common elements are depicted by the same reference numerals in FIGS. 1 and 2a, 2b.

A write control line 32 leads from the interface 22 to a write decoder 34. The write decoder receives the binary values put out by the substitution PROM 26 and produces therefrom a write decode bus 36 which extends to a write bit decoder 38 and also to the substitution circuit 28. The write bit decoder 38 produces and puts out a write disable signal over a bus 40 extending to tri-state write buffers 42a-h respectively associated with the main memory array chips 16a-h.

When the substitution table in the PROM 26 indicates that a particular address to be written is part of a block of addresses where a data bit of a chip 16x (where 16x is one of the chips 16a-16h) is to be mapped out, and a replacement block from a spare data bit of the chip 16q mapped in place thereof, the write buffer 42 of the particular chip 16 to be disabled for the block is not enabled during the write operation. At the same time, the replacement bit from the spare chip 16q is gated via one of the tri-state buffers comprising the substitution circuit 28 onto the data bus 30.

Similarly, a read control line 44 leads to a read decoder 46 which is responds to the binary value put out by the PROM 26 to put out read decode values over a read decode bus 48. The bus 48 leads to a read bit decoder 50 which generates a read disable signal and puts it out over a bus 52 to tri-state read buffers 54a-h which are respectively associated with main array chips 16a-h. The signals over the bus 52 disable a block of addresses in a particular chip 16x having a nonfunctional location during data read operations, while the read decode bus 48 operates a selected read tri-state buffer of the substitution circuit 28 in order to map the replacement bit from the spare Audio DRAM chip 16q onto the bit position of the mapped out chip 16 during read operations to addresses lying within this particular address block.

One particularly advantageous application for the memory system 10 is to provide cache memory for caching data transfers between a host computer and a fixed disk data storage subsystem. Since the memory system 10 is resident on a system bus, by virtue of the system bus interface logic and edge connector 14, the data transferred between the disk and main memory of the host computer is available for caching within the system 10. A caching routine implementing one of the several known caching algorithms may be executed by the host computer and cause the computer to write and retrieve the data from the system 10 in response to file activity of an applications program.

To those skilled in the art to which the present invention pertains, many applications and widely differing embodiments will be suggested by the foregoing example without departure from the spirit and scope of the present invention. For example, if few defects are determined to be present within the main array 16a-p, the spare chip 16q may be of a smaller data storage capacity (and lower cost), and it may be addressed by the address lines of the lowest 128 bits and by special block address lines generated and put out by the PROM 26. Thus, it is to be understood that the disclosures herein are presented by way of illustration only of principles and aspects of the invention and should not be deemed as limiting the scope thereof, as more particularly defined by the following claims.

What is claimed is:

1. A solid state memory array using address location substitution to compensate for non-functional storage cells of the array, comprising:

an address bus means for receiving memory location addresses from a source, a bidirectional data bus means having L parallel data bit lines, wherein L has a value of at least 8, for transferring data values between the source and the memory array, a plurality of partly defective VLSI memory array chips each containing at least one megabit of data storage capacity, each having defective memory cell locations, each being connected to the address bus means, and each providing m bit lines of data storage at each said memory location address, wherein m has a value between 1 and 4, each said memory array chip having a memory array chip bidirectional tri-state driver means connected between said m bit lines thereof and corresponding ones of said parallel data bit lines, at least one VLSI substitution memory chip containing at least one megabyte of data storage capacity, being connected to the address bus means, and providing m bit lines of data storage at each said memory location address, a substitution chip tri-state driver means connected between said m bit lines of said substitution memory chip and all of said parallel data bit lines, programmable read only memory means connected to be addressed by said address bus means and programmed for putting out a binary coded value which has been coded to identify each said defective memory cell location of each said memory array chip, decoder means connected to receive and decode said binary coded value into tri-state driver control values and for applying said values to said substitution chip tri-state driver means and to one of said memory array chip bidirectional tri-state driver means so as to disable said memory array chip associated with said driver means when a said defective memory cell location thereof is addressed, and to enable said substitution memory chip at said location and connect it to the data bus means in place of said associated memory array chip.

2. The memory array set forth in claim 1 wherein the memory chips of the memory array comprises a plurality of DRAM chips, and wherein the memory array further comprises memory controller means connected between the lines of the address bus and the plurality of chips of the memory array for generating and supplying time multiplexed column address selection information and row address selection information to the memory array from logical signals on the lines of the address bus means and for generating and supplying recurrent refresh signals to the chips of the array.

3. The memory array set forth in claim 2 wherein the chips of the array comprise audio DRAM chips.

4. The memory array set forth in claim 2 wherein the chip comprises at least one Audio DRAM chip.

5. The memory array set forth in claim 1 wherein the substitution memory chip has the same predetermined data storage size as do the chips comprising the memory array.

6. The memory array set forth in claim 1 wherein the programmable read only memory means is connected to predetermined high address bit positions of the address bus means and is programmed for putting out the binary coded value as a block of addresses which includes the location of the said defective memory cell location of the said memory array chip.

7. The memory array set forth in claim 6 wherein size of each said block of addresses includes 128 consecutive address locations.

8. The memory array set forth in claim 1 wherein the main array includes parity bit memory chip means for storing a parity bit for each data word stored in said array.

9. The memory array set forth in claim 8 wherein the parity bit memory chip means comprises an Audio DRAM chip.

10. The memory array set forth in claim 1 further including a second VLSI substitution memory chip containing at least one megabyte of data storage capacity, also being connected to the address bus means, and also providing m bit lines of data storage at each said memory location address, and a second substitution chip tri-state driver means connected between the said m bit lines of the second substitution memory chip and all of said parallel data bit lines, and wherein said decoder means is connected to control said second substitution chip tri-state driver means.

11. The memory array set forth in claim 1 wherein the VLSI substitution memory chip has defective memory cell locations at address locations other than at address locations of each one of said memory array chips.

* * * * *